US010924308B1

(12) United States Patent
 Crawford (10) Patent No.: US 10,924,308 B1
(45) Date of Patent: Feb. 16, 2021

(54) SMART RECEIVER WITH COMPRESSIVE SENSING AND MACHINE LEARNING

(71) Applicant: RAYTHEON APPLIED SIGNAL TECHNOLOGY, INC., Sunnyvale, CA (US)

(72) Inventor: Michelle L. Crawford, Dallas, TX (US)

(73) Assignee: Raytheon Applied Signal Technology, Inc., Sunnyvale, CA (US)

( * ) Notice: Subject to any disclaimer, the term of this patent is extended or adjusted under 35 U.S.C. 154(b) by 0 days.

(21) Appl. No.: 16/745,204

(22) Filed: Jan. 16, 2020

(51) Int. Cl.
| H04L 25/49 | (2006.01) |
| H04B 1/7176 | (2011.01) |
| H03H 17/02 | (2006.01) |
| H04L 5/06 | (2006.01) |
| G06N 20/00 | (2019.01) |
| H04L 27/26 | (2006.01) |
| G01S 7/02 | (2006.01) |
| H04L 27/36 | (2006.01) |

(52) U.S. Cl.
 CPC .......... *H04L 25/4902* (2013.01); *G01S 7/021* (2013.01); *G01S 7/023* (2013.01); *G06N 20/00* (2019.01); *H03H 17/0266* (2013.01); *H04B 1/7176* (2013.01); *H04L 5/06* (2013.01); *H04L 27/264* (2013.01); *H04L 27/2636* (2013.01); *H04L 27/364* (2013.01)

(58) Field of Classification Search
 CPC ............... H04L 25/4902; H04L 27/364; H04L 27/2636; H04L 27/264; H04L 5/06; H04B 1/7176; G01S 7/023; G01S 7/021; G06N 20/00; H03H 17/0266

USPC ......................................... 375/238; 342/25 A
See application file for complete search history.

(56) References Cited

U.S. PATENT DOCUMENTS

| 6,043,771 A | 3/2000 | Clark et al. |
| 6,876,321 B1 | 4/2005 | Slutzky et al. |
| 9,028,412 B2 * | 5/2015 | Rothberg ............. A61B 8/4483 |
| | | 600/438 |

(Continued)

OTHER PUBLICATIONS

Slavinsky et al., "The Compressive Mutliplexer for Multi-Channel Compressive Sensing," IEEE International Conference on Acoustics, Speech and Signal Processing—ICASSP'11, Prague, May 2011, pp. 3980-3983.

(Continued)

*Primary Examiner* — Fitwi Y Hailegiorgis
(74) *Attorney, Agent, or Firm* — Lewis Roca Rothgerber Christie LLP (57) ABSTRACT

System and method for identifying an RF emitter include: channelizers for channelizing RF signals into several channels; a compressive sensing (CS) encoder for each channel to CS encode the channelized signal to produce an encoded channelized signal in each of the plurality of channels; a summer to sum the encoded channelized signals of all of the plurality of channels to produce an I/Q data; a channelized pulse detection circuit to detect pulses in each channel and produce encoded pulse snippets from the I/Q data; a CS decoder for each channel to CS decode the encoded pulse snippets; a first machine learning device to characterize the decoded pulse snippets and to produce pulse description words (PDWs); and a second machine learning device to associate the PDWs with one or more RF emitters and identify the one or more RF emitters.

20 Claims, 8 Drawing Sheets

(56) References Cited

U.S. PATENT DOCUMENTS

9,197,283 B1 11/2015 Nguyen et al.
2016/0061950 A1* 3/2016 Xu ..................... G01S 15/8997
342/25 A

OTHER PUBLICATIONS

Selim et al., "Spectrum Monitoring for Radar Bands using Deep Convolutional Neural Networks," L. A. (Dec. 2017). Spectrum monitoring for radar bands using deep convolutional neural networks. In *GLOBECOM 2017—2017 IEEE Global Communications Conference* (pp. 1-6).

International Search Report and Written Opinion dated Dec. 21, 2020 for corresponding PCT Application No. PCT/US2020/053153 (11 pages).

\* cited by examiner

SMART RECEIVER WITH COMPRESSIVE SENSING AND MACHINE LEARNING

FIELD OF THE INVENTION

The disclosed invention generally relates to signal processing and electronic circuits and more particularly to a smart receiver with compressive sensing and machine learning.

BACKGROUND

Digital wideband architectures are useful for high speed digital communication and radar systems. Herein, the term wideband may be used to refer to bandwidths from kilohertz (KHz) to multi-gigahertz (GHz) bandwidths. Channelized architectures become necessary when the bandwidth of the signals being considered are a multiple of the speed of digital logic to process the signals or a matched bandwidth is required for signals with no a-priori knowledge of their RF. A channelizer is a circuit implementing a process, which decomposes a single wideband input signal into a specified number of narrower band channels. The input signal typically has a higher sample rate than the sample rate of the decomposed channels. A typical RF approach to decompose an input signal, is to first shift the frequency of input signal by multiplying it with a complex sinusoid, then pass the signal through a low pass filter and alternatively a decimator (rate changer) for each of the output narrower band channels. A typical digital signal processing approach utilizes a polyphaser filter bank.

Channelized radio receivers divide an incoming radio frequency signal into plural frequency-segregated segments for performing differing signal processing of the output signal in different channels, the physical separation of hardware relating to different channels, reduction of data rate per channel, and the preclusion of cross channel interference effects, among others. In such typical channelization techniques, a frequency and a channel must be calculated and specified for each signal.

Figure 1:
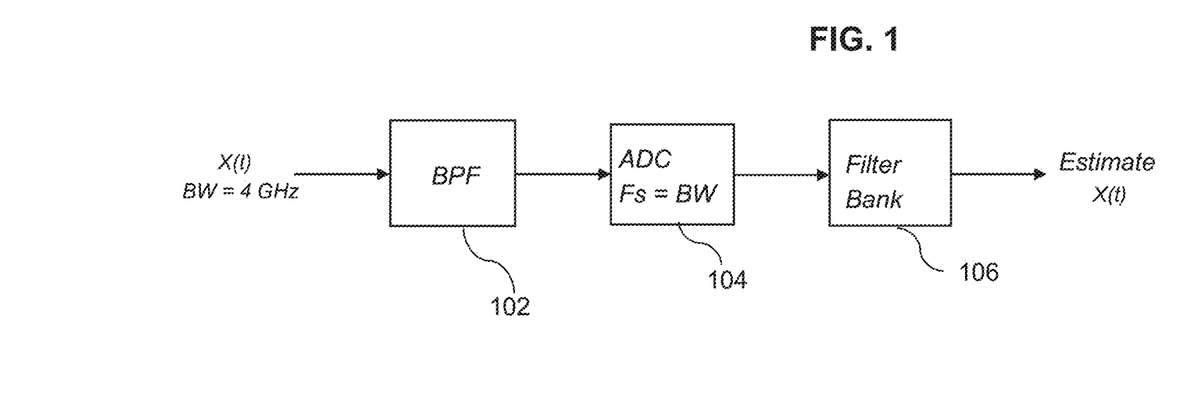
FIG. 1 shows a conventional wideband channelized receiver using full Nyquist sampling rate.

FIG. 1 shows a conventional channelized receiver. As shown, a wide band input analog signal X(t), with a frequency of, for example 4 GHz, is input to an optional anti-aliasing filter 102 to reject signals outside of the band of interest. The anti-aliasing BPF 102 filter attenuates signals outside of the spectrum of interest. A full Nyquist rate analog-to-digital converter (ADC) 104 with a sampling frequency Fs, equal to or greater than the Nyquist frequency of the input signal, samples the output of the anti-aliasing filter 102, converting the analog signal to a digital signal. The output of the ADC 104 is then channelized by a (fixed resolution) filter bank 106. The full Nyquist rate ADC 104 samples the entire signal spectrum of interest. Sampled data are separated via the fixed filter 106 bandwidth. The filter bank 106 decomposes the wideband signal into equally spaced partitions. An example of a channelizing filter bank is a polyphaser, which splits an input signal into a given number N (mostly a power of 2) of equidistant sub-bands. These sub-bands are then subsampled by a factor of N, so they are critically sampled.

Some approaches use the above-described conventional channelized receiver followed by compressive sensing to unwrap the aliased narrow-band spectrum resulting from under sampling. Compressive sensing (CS) is typically composed of encoding and decoding phases, where an input (analog) signal is sampled below the Nyquist rate during encoding, and then reconstructed from (digital) samples of input signals at the decoding phase, which is computationally complex and costly, and requires large storage. This approach works well for detection of sparse (narrow-band) signals across the wide band of interest. Compressive sensing (CS) takes advantage of the fact that a signal can be sparsely represented in a transformed domain (e.g., when a sinusoidal or cosine signal is transformed to Fourier domain by applying the Fourier transform, it can be represented by just two coefficients.). Many signals can be sparsely represented in a transformed domain and thus contain many coefficients in that domain close to or equal to zero (e.g., Fourier or Wavelet). The approach typically starts with taking a weighted linear combination of samples (compressive measurements) using a set of basis functions that are different from the set of basis functions in which the signal is known to be sparse.

Figure 2:
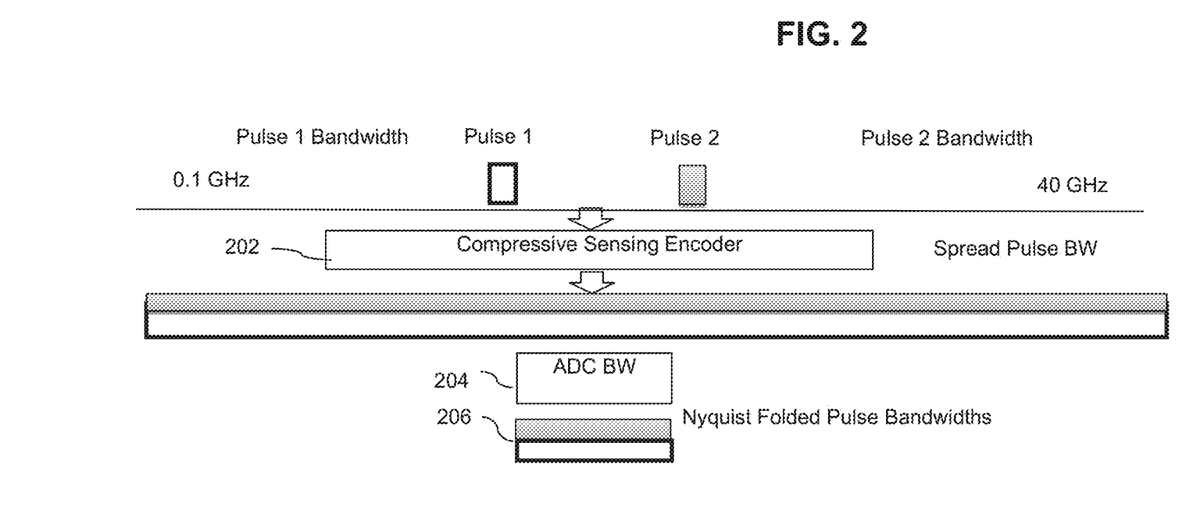
FIG. 2 depicts a traditional compressive sensing receiver.

FIG. 2 depicts a traditional compressive sensing receiver. As shown, two signal pulses, Pulse 1 and Pulse 2 are spread out over a combined bandwidth of 40 GHz. A conventional CS encoder 202 spreads each signal over the full bandwidth of 40 GHz and produces a Nyquist folded pulse signal for each of the Pulse 1 and Pulse 2 with a limited Nyquist folded bandwidth 206 using an ADC 204. Since the encoder spreads all signals evenly across the full bandwidth, all of the signal energy and all of the noise energy is preserved during the Nyquist folding process produced by the narrower band ADC. In this case, the Nyquist folded pulse signals are folded on top of each other and therefore they need to be separated by CS decoding. Further processing can separate the sparse signals that don't overlap in time and frequency. Accordingly, the processing to detect the signals is performed after the decoding of the CS encoding. This requires complex processing to reconstruct the folded signals.

However, compressing sensing suffers from signal-to-noise (SNR) degradation due to noise folding and pulse on pulse interference issues.

SUMMARY

In some embodiments, the disclosed invention is a smart receiver with compressive sensing and machine learning that identifies and optionally locates radar signals and their characteristics, for example, what type of RF emitters or radars and whether they are friendly radars or "threat" radars.

In some embodiments, the disclosed invention is an RF receiver for identifying an RF emitter. The RF receiver includes: one or more channelizers for channelizing a plurality of RF signals into a plurality of channels; a compressive sensing (CS) encoder for each channel to CS encode the channelized signal to produce an encoded channelized signal in each of the plurality of channels; a summer to sum the encoded channelized signals of all of the plurality of channels to produce an I/Q data; a channelized pulse detection circuit to detect pulses in each channel and produce encoded pulse snippets from the I/Q data; a CS decoder for each channel to CS decode the encoded pulse snippets; a first machine learning device to characterize the decoded pulse snippets and to produce pulse description words (PDWs); and a second machine learning device to associate the PDWs with one or more RF emitters and identify the one or more RF emitters.

In some embodiments, the disclosed invention is a method for identifying a radio frequency (RF) emitter. The method include: channelizing a plurality of RF signals into a plurality of channels; for each channel, compressive sensing (CS) encoding the channelized signal to produce an encoded channelized signal in each of the plurality of channels; summing the encoded channelized signals of all of the plurality of channels to produce an I/Q data; detecting pulses in each channel and producing encoded pulse snippets from the I/Q data; CS decoding the encoded pulse snippets; characterizing the decoded pulse snippets to produce pulse description words (PDWs), by a first machine learning device; and associating the PDWs with one or more RF emitters and identify the one or more RF emitters, by a second machine learning device.

A processor may then determine a location of the identified one or more RF emitters. In some embodiments, each CS encoder alters the CS encoding to limit spreading bandwidth of the channelized signal using a Compressive Multiplexor (CMUX) technique and samples its input signal at a range of 5% to 10% of a system clock rate, which is a narrower bandwidth than a bandwidth of the receiver.

In some embodiments, the channelized pulse detection circuit determines which channel the I/Q data is coming from to determine type, timing and frequency of the channelized signals.

BRIEF DESCRIPTION OF THE DRAWINGS

A more complete appreciation of the disclosed invention, and many of the attendant features and aspects thereof, will become more readily apparent as the invention becomes better understood by reference to the following detailed description when considered in conjunction with the accompanying drawings in which like reference symbols indicate like components, wherein.

DETAILED DESCRIPTION

The disclosed invention will now be described more fully with reference to the accompanying drawings, in which exemplary embodiments thereof are shown. The disclosed invention may, however, be embodied in many different forms and should not be construed as being limited to the embodiments set forth herein. Rather, these embodiments are provided so that this disclosure is thorough and complete, and will fully convey the concept of the disclosed invention to those skilled in the art. In some embodiments, the method of the disclosed invention is performed by an electronic circuit to transform a high bandwidth analog signal to a plurality of digital signals representing the analog signal. In some embodiments, the method of the disclosed invention is performed by an electronic circuit and a processor, such as a digital signal processor.

In some embodiments, the disclosed invention is a smart receiver or sensor that includes compressive sensing and machine learning capabilities for identifying and optionally locating RF signals, for example, radar signals and their characteristics. In some embodiments, the smart receiver or sensor may be a low cost, size, weight and power (SWAP-C) smart receiver or sensor that may be positioned on an airborne, ground or sea moving platform that covers a wide instantaneous bandwidth of 40 GHz or more in close proximity to the target RF emitters (e.g., radars) the signals of which are to be detected. When used in a constellation of three or more vehicles, the smart receiver or sensor provides nearly instantaneous detection, identification and precision geolocation of radars within its field of view.

Previous attempts to provide low SWAP-C smart sensors use relatively narrowband receivers (<100 MHz) that scans the RF spectrum sequentially over time. In these sensor systems, multiple sensors have to be synchronized in their RF scan patterns. However, RF emitters or radars that are on for short durations can be missed between RF scan re-visits that may take longer time.

In some embodiments, the smart receiver or sensor of the disclosed invention combines three main components. Moreover, machine learning (ML) may be used to characterize RF emitter or radar pulses from digitized pre-detection (Pre-D) data, data that has been detected during radar pulse events. The Pre-D data is kept in the compressive sensing domain to eliminate the need for complex and intensive signal recovery (reconstruction) computations. Machine learning (ML) is also used to separate and identify emitter (radar) types from characterized emitter (radar) pulses. In some embodiments, known convolutional neural networks or similar networks are used to implement ML algorithms and enable rapid and efficient processing versus traditional approaches.

In some embodiments, RF digitization, compressing sensing encoding, pulse detection, characterization and identification may all be performed within a single integrated circuit (IC), for example, a single field programmable gate array (FPGA) device may accommodate the circuits for RF digitization, signal processing and machine learning acceleration within a single re-programmable device, which minimizes cost, size and power versus multiple devices used in the past.

In some embodiments, compressive sensing is utilized to detect RF (e.g., radar) pulses and ML is used to detect, sort and identify RF (e.g., radar) signals. In some embodiments, the receiver of the disclosed invention has a modular instantaneous bandwidth, where additional bandwidth can be added without changing the compressive sensing and ML processes. In some embodiments, communication bandwidth is minimized by sending only high priority signals and delaying or suppressing the low priority signals. Moreover, performance may be tailored for an area of interest by training the ML algorithms to optimize performance against high priority signals. For example, due to geographical constraints (open water, land, urban), geopolitical constraints and prior intelligence, a given area of interest will contain a small subset of the global inventory of possible RF emitters (e.g. radars). By training the ML algorithms against this small set of possible RF emitters, the classifiers employed in these algorithms will exhibit exceptional performance versus a classifier trained against every known RF emitter.

In some embodiments, unique compressive sensing coding and the use of compressive multiplexing techniques allow RF pulses to be detected with high sensitivity in the compressive sensing domain using, for example, known "classical" processing approaches. This way, decoding is only needed when pulses are detected and thus saving significant processing resources. In some embodiments, the smart receiver or sensor of the disclosed invention utilizes known machine (deep) learning-based speaker diarization techniques to separate, associate and identify RF emitters.

Speaker diarization, a combination of speaker segmentation and speaker clustering, is the known process of partitioning an input audio stream into homogeneous segments according to the speaker identity, which enhances the readability of an automatic speech transcription by structuring the audio stream into speaker turns and, when used together with speaker recognition systems, by providing the speaker's true identity. Speaker diarization is typically used to answer the question "who spoke when?"

Figure 3:
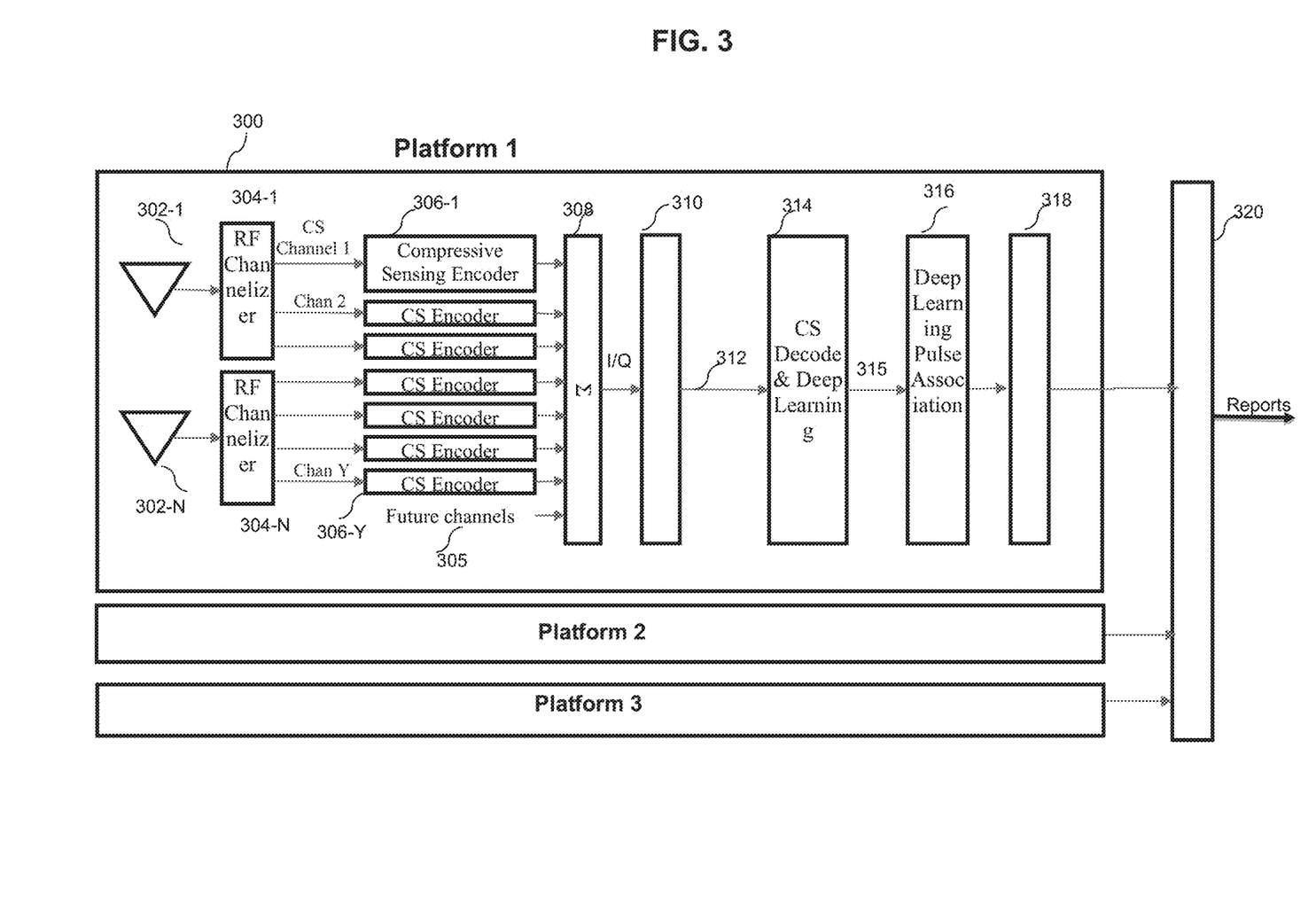
FIG. 3 is a block diagram of an exemplary smart receiver/sensor, according to some embodiments of the disclosed invention.

FIG. 3 is a block diagram of an exemplary smart receiver/sensor 300, according to some embodiments of the disclosed invention. As illustrated, antennas 302-1 to 302-N receive RF signals from one or more RF emitters, for example, radars. The smart receiver/sensor 300 analyzes the received RF signals, determines what type of signals they are and what type of emitters are transmitting them. When there are three or more receivers/sensors 300 positioned at different location, for example, one or more on airborne platforms, one or more on ground platforms and/or one or more on sea platforms, the location of those emitters may be determined, by one or more of the (processor included in) receivers or a server computer, by known methods, for example, triangulation methods.

The received RF signals by each antenna are channelized by a respective channelizer 304-1 to 304-N to a total of Y channels, as shown. Each RF channelizer 304-1 to 304-N decomposes its RF input into multiple channels, where each channel has the same bandwidth. The RF input may be different for each channelizer as a function of the antenna that is feeding it. The number of output channels and any overlap across channels is designed uniquely for each RF channelizer to produce identical channels in bandwidth and Intermediate Frequency (IF). The output of each channel 1-Y is then input to a respective CS encoder 306-1 to 306-Y. Each CS encoder mixes its input signal with a unique binary spreading code. The chip rate of this code determines the amount of spreading bandwidth employed. In some embodiments, the CS encoders 306-1 to 306-Y operate with a narrow bandwidth chip rate, instead of a full bandwidth chip rate as the conventional CS encoders do.

Conventional CS encoders utilize a single encoder, the chip clock rate of which must be equal to the full RF bandwidth of the system to ensure that a portion of every signal within that full bandwidth lies within the limited bandwidth of the ADC in the signal path. Moreover, the Nyquist folding of the conventional CS encoders occurs during the digitization process, where target signal structure may be lost and all target signals may be entangled. Consequently, detection and separation of signals requires extremely complex and intensive decoding computations, which are not currently feasible for small SWAP-C payloads.

In contrast, some embodiments of the disclosed invention explicitly control the Nyquist folding by channelizing the full RF bandwidth into Y identical channels, where the channel bandwidth is equal to the ADC bandwidth. The Nyquist folding is achieved by combining all of the Y channels in a simple summation (308). The CS encoders in these embodiments determine post detection, which one of the Y channels the signal originated from. This can be accomplished by using narrow chip rate bandwidths. Thus, the target signal structure is preserved, allowing classical (i.e., low SWAP-C) signal detection techniques to be performed in the compressive (summed channel) domain. As long as the signal environment remains sparse, the only degradation is loss of sensitivity due to noise folding. This way, the CS encoding process has a low computational complexity and is relatively simple to implement in hardware.

The CS encoded signals from each channel are then combined (summed) by a summer 308. In some embodiments, the summer 308 may have capabilities for accepting extra inputs 305 for addition of any future channels, making the receiver/sensor 300 modular, where additional CS encoders and channelizers may be added to increase the compression ratio, without major changes and degradation to the system performance and changes to the detection, decoding and machine learning processes. Since the input signal can be received as a real value or a complex value including a real component (1) and an imaginary component (Q), the output of the CS encoders 306-1 to 306-Y and the summer 308 are in the form of I/Q data. As known in the art, I/Q data is a signal representation much more precise than just using a series of samples of the momentary amplitude of the signal.

Each channel utilizes a unique spreading code, much like a CDMA system. The codes can be pseudo-noise (PN) or orthogonal codes. The unique spreading code utilized in each CS encoder enables the CS decoder to determine which of the Y channels the signal was received from, which in turn determines the received signal RF carrier frequency. This is done by multiplying each of the codes by the detected signal and measuring the average power over the signal (pulse). The code that produces the maximum signal power is assumed to be the originating code and thus the channel from which the signal originated. The I/Q data is then read out of each channel of the adder 308 by a channelized pulse detection circuit 310.

In some embodiments, the output 312 of the channelized pulse detection circuit is in the form of encoded pulse snippets. When the I/Q is combined with metadata, including channel and filter bank number, time of first sample, sample rate and background noise, a pulse snippet is formed for each received pulse. (See Pulse Detection Circuit in FIG. 8). In general, channelized pulse detection circuit 310 detects the presence of an RF (radar) signal in a matched bandwidth, however, no information about the type of the RF emitter or the radar is known at this time.

Output 312 of the channelized pulse detection circuit is then input to Y CS decoders in 314 (one for each Y channels). The decoders (shown as part of 314) accept compressive decode signals 312 (e.g., encoded pulse snippets). Decoders perform the inverse of the encoding spreading process. In other words, each pulse snippet is de-spread in much the same way as a CDMA signal is de-spread, to recover the desired user signal. In some embodiments, the process is performed by multiplying the I/Q snippets by the same PN or orthogonal code used in the encoder. However, since the I/Q snippets were filtered in a filter bank, the codes are first filtered in the same way. This can be performed in real-time or offline and stored in memory. Unlike a CDMA system, there is no a-priori information that is used to select a single code. Therefore, all codes are applied to the pulse snippet and the decoded snippet with the maximum power is selected for further processing. The code that is used to produce this maximum power snippet then provides a reference back to the corresponding CS channel and its RF.

The outputs of the decoders are then input to a machine (deep) learning pulse characterizer (MLPC) 314. The MLPC 314 characterizes the detected pulse, using the output signal 312 and a trained process to characterize the pulse (described in more detail with respect to FIG. 6). Although the CS decoder and the MLPC 314 are depicted in the same block 314 in FIG. 3, one skilled in the art would recognize that they may be in separate components (blocks). In some embodiments, the MLPC portion of the CS decoder removes Compressive Sensing artifacts and MLPC 314 characterizes the pulse in terms of a refined time of arrival, pulse width, carrier frequency and modulation parameters. In some embodiments, the MLPC 314 is modeled after the known techniques described in Selim, A., Paisana, F., Arokkiam, J. A., Zhang, Y., Doyle, L., & DaSilva, "Spectrum Monitoring for Radar Bands using Deep Convolutional Neural Networks," L. A. (2017, December). Spectrum monitoring for radar bands using deep convolutional neural networks. In *GLOBECOM 2017-2017 IEEE Global Communications Conference* (pp. 1-6). IEEE.), the entire contents of which is hereby expressly incorporated by reference.

Known Neural Networks operate on 2-D arrays, accordingly 4096 I/Q samples are used to populate two 64 by 64 arrays. One array is populated with amplitude data. The second array is populated with delta phase data (the change in phase from one I/Q sample to the next). The CNN is composed of N convolutional layers. Each layer uses a different convolutional primitive to extract features that are then combined in a final layer before a soft decision classifier used to extract the pulse parameters. The resulting collection of pulse parameters, including carrier frequency (or RF), TOA, pulse width, pulse modulation type and modulation parameters (e.g. chirp rate or baud rate) is output as a Pulse Descriptor Word (PDW).

Figure 7:
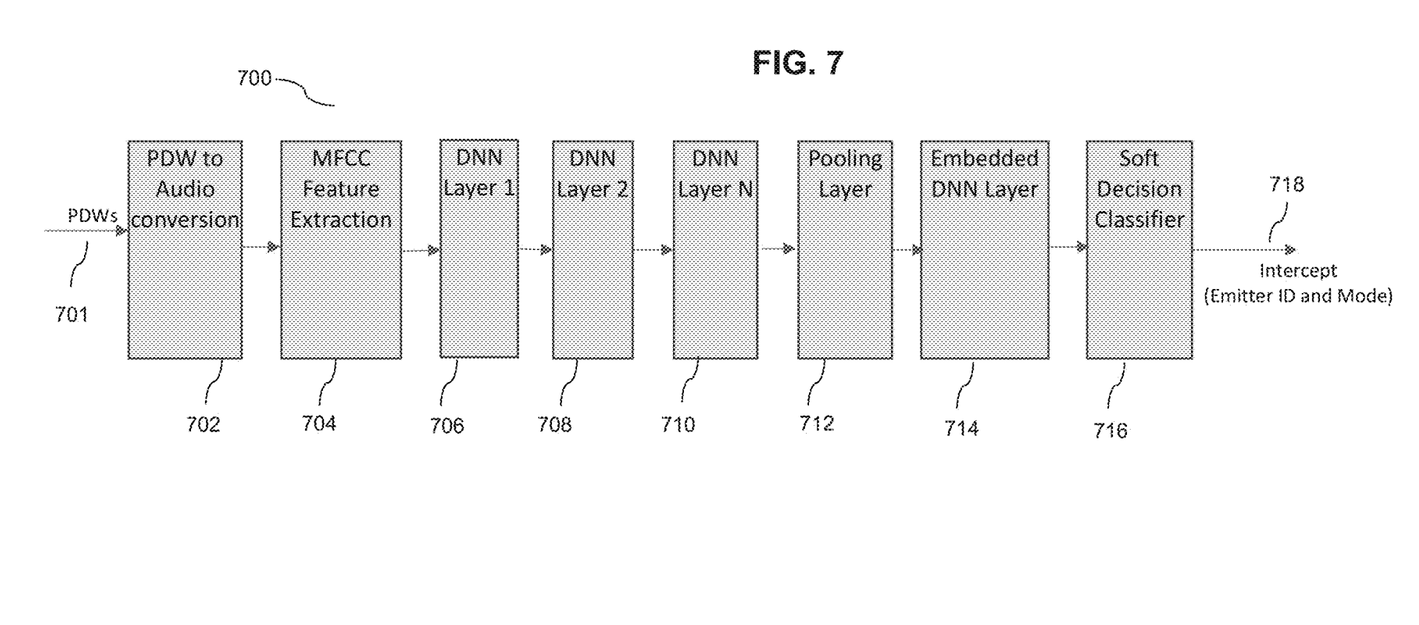
FIG. 7 illustrates a simplified block diagram of an exemplary machine learning for associating pulses with certain type of emitters, according to some embodiments of the disclosed invention.

PDW signal 315 is then input to another machine learning (ML) function, 316 that associates the detected pulses and identifies the emitter (radar) that generated the pulses (described in more detail with respect to FIG. 7). In some embodiments, the ML 316 may be a deep learning machine that uses multiple layers to progressively extract higher level features from the characterized pulses to associate them with certain type of emitter and identify the emitter. In some embodiments, an optional intercept filter 318 prioritizes the intercepts, for example, by filtering out the low priority intercepts and outputting the high priority intercepts to a geolocation platform 320. The geolocation platform 320 receives the intercepts from three or more receiver platforms (e.g., platforms 1, 2 and 3, as shown) and locates the identified emitter or radar by known locating methods, for example, triangulation and provides various reports of the identified emitter(s). The reports may then be used by another system to mitigate the threat posed by the threatening radars.

Figure 4:
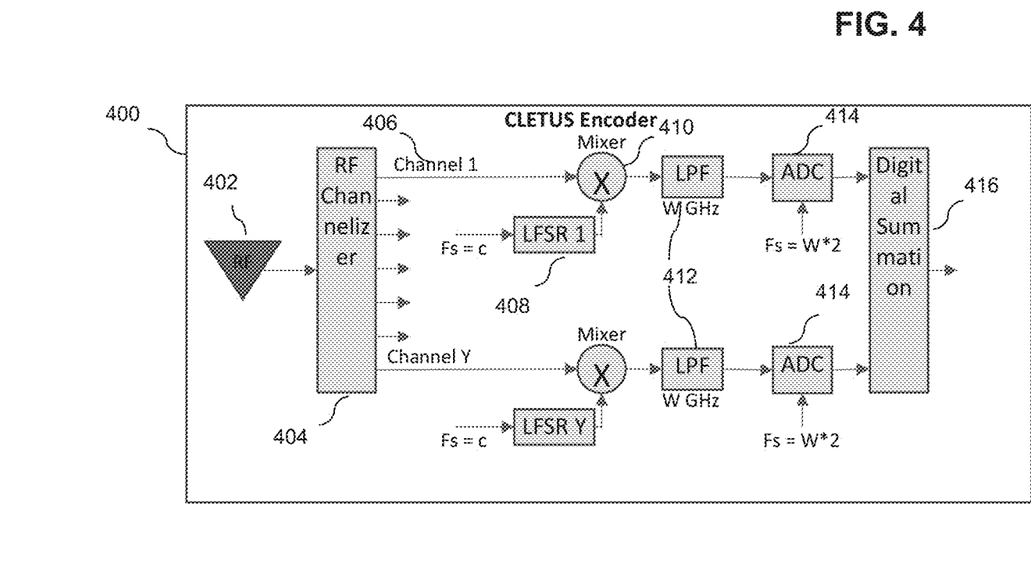
FIG. 4 illustrate an exemplary compressive sensing encoder, according to some embodiments of the disclosed invention.

FIG. 4 illustrates an exemplary CS encoder 400, according to some embodiments of the disclosed invention. As shown, antenna 402 receives an RF signal from one or more RF emitters, for example, one or more radars. The received RF signal is then channelized by a channelizer 404 to produce a total of Y channels 406-1 to 406-Y. Channelizer 404 covers the entire RF spectrum being monitored and splits it up into equal bandwidth (W GHz) CS channels or bands that are contiguous. In each Y channel, the channelized signal is mixed with a low frequency sampled pseudo-noise or orthogonal code, sampled at $F_s=c$, by a corresponding mixer 410, where $F_s$ is the sampling (clock) rate. In these cases, $F_s=c$ has a much lower sampling rate than the conventional CS encoders. For example, c is in the range of 5 MHz or less, while the clock (sampling) rate of the conventional CS encoders is typically twice the system bandwidth ($F_s=2*W$) usually multiple GHz.

The clock signal (with a frequency of $F_s$) is input to a random number generator 408 (e.g., a linear feedback shift register (LFSR) or orthogonal code generator) in each channel to produce a unique CS spreading code for each channel, which in turn is mixed with the channelized signal by the corresponding mixer 410. The mixed signal then passes through a lowpass filter 412 to eliminate spectral images and is then converted to a digital signal by a corresponding ADC 414. The digital signals of all channels 406-1 to 406-Y are then digitally summed by a summer 416 to produce the output of the CS encoder 400. In some embodiments, the ADC 414 function may be performed after the summer, which means the summer is analog.

In some embodiment, CS encoder 400 adapts the known Compressive Multiplexor (CMUX) technique by altering the CS encoding method to limit the spreading bandwidth so that the RF structure of the environment is preserved, allowing classic pulse energy detection to be employed. The technique also preserves pulse on pulse detection techniques. For example, if the system bandwidth is S GHz and the compressive sensing bandwidth is W GHz, the folding rate would be Y=S/W and the signal bandwidth would be J, where J<<W<<S. This reduces the signal processing complexity by a factor of Y while J<<W satisfies the sparse assumptions required in a CS system. A more detailed Compressive Multiplexor is described in J. P. Slavinsky, J. Laska, and R. G. Baraniuk, "The Compressive Mutliplexer for Multi-Channel Compressive Sensing," IEEE International Conference on Acoustics, Speech and Signal Processing—ICASSP'11, Prague, May 2011, the entire contents of which is hereby expressly incorporated by reference.

In some embodiments, CS encoding and channel combining can be performed in both the digital and analog RF/IF domains allowing instantaneous bandwidths to scale to several (e.g., 40) GHz and beyond. In some embodiments, the bandwidth is modular, allowing additional channels to be added without altering the logic circuits, for example a Digital Signal Processor (DSP) and ML logic of the smart receiver.

Figure 5:
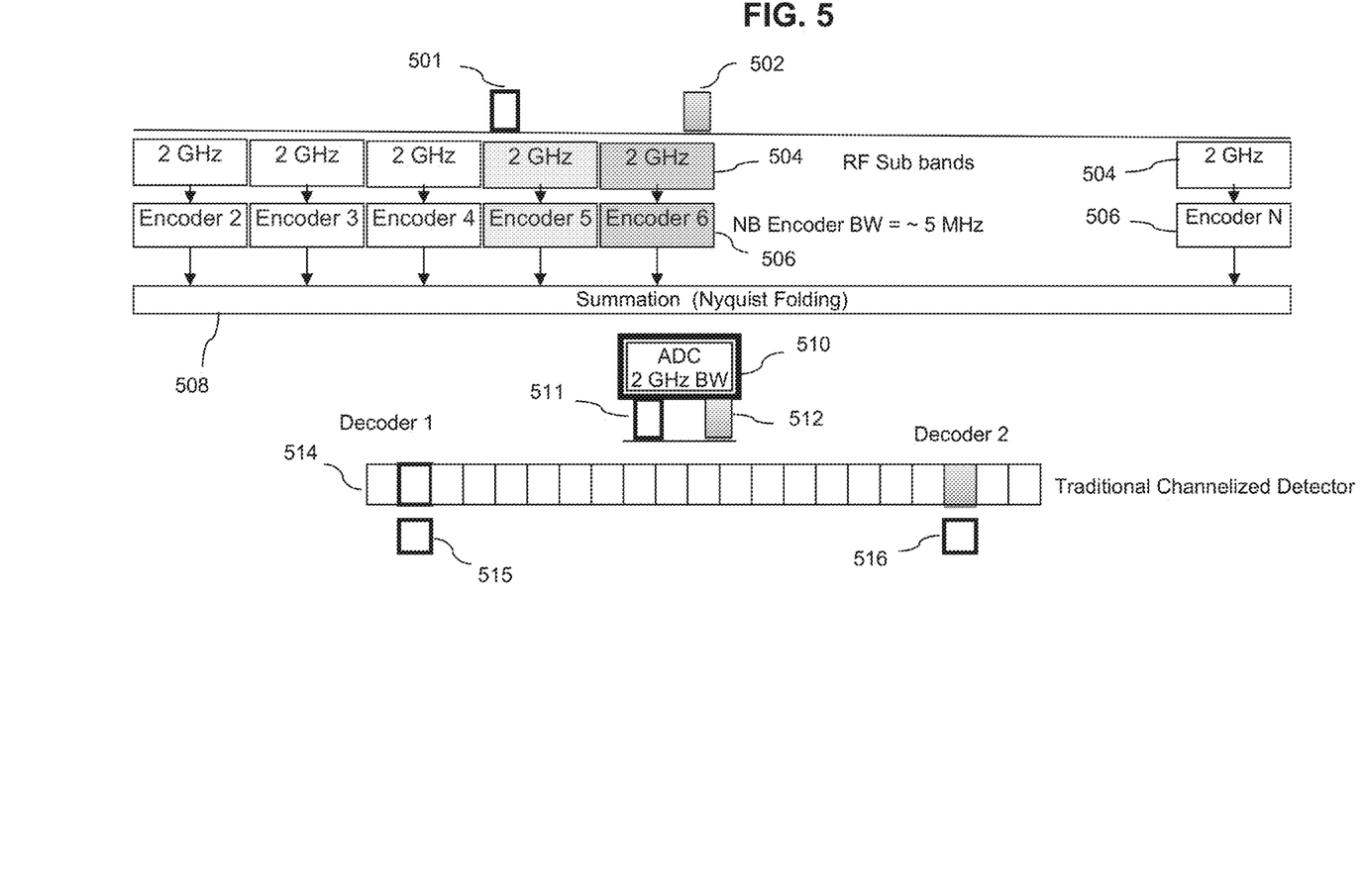
FIG. 5 depicts an example of a plurality of CS encoders, Nyquist folding and CS decoding of two exemplary pulses, according to some embodiments of the disclosed invention.

FIG. 5 depicts an example of a plurality of CS encoders, Nyquist folding and CS decoding of two exemplary pulses, according to some embodiments of the disclosed invention. As shown, a first pulse 501 in one sub-band and a time coincident second RF pulse 502 in another sub-band are channelized into N RF sub-bands of 2 GHz (504) each. The channelized RF signals are then CS encoded by corresponding N CS encoders 506 and Nyquist folded by a summer 508, collapsing the two sub bands containing pulse 501 and 502 into a single channel containing both pulses (511 & 512). The analog summed RF signal is then converted by an ADC 510.

Digital signals 511 and 512 are then detected using a filter bank and a constant false alarm detector. The bandwidths of the filter bank channels are greater than the pulse bandwidths and the pulses are separated by one or more channels, allowing the two-time coincident pulses to be separately detected. Two pulse snippets (515 & 516) are created. In the CS decoding process, where each pulse snippet is de-spread with all N encoding codes. The maximum average power for pulse 515 is achieved using the encoder 5 code. The maximum average power for pulse 516 is achieved using the encoder 6 code. This means pulse 515 originated in sub-band 5 (pulse 501) and pulse 516 originated in sub-band 6 (pulse 502).

This way, compressive sensing is used to cover a wide instantaneous bandwidth using a low-cost narrowband receiver. For instance, 40 GHz of instantaneous RF spectrum can be processed with a single 2 GHz receiver using a 20:1 compression ratio. Other ratios are possible, extending the range well beyond 40 GHz or reducing the SWAP-C even further by using a narrower band receiver. The allowable compression ratio may be determined by the required system sensitivity. The receiver or sensor is modular, meaning that more compressive sensing encoders and channelizes may be added to the receiver to increase the compression ratio, without degradation to the system performance.

This new approach allows use of traditional pulse detection techniques in the compressed domain, where CS decoding is only required where energy is present since the channelized detectors separate pulse on pulse. Moreover, CS decoding is performed after pulses are detected. Previous approaches require decoding to be performed on all samples, requiring significant processing resources. This way, because pulse environments are sparse, decoding resources are significantly reduced.

Figure 6:
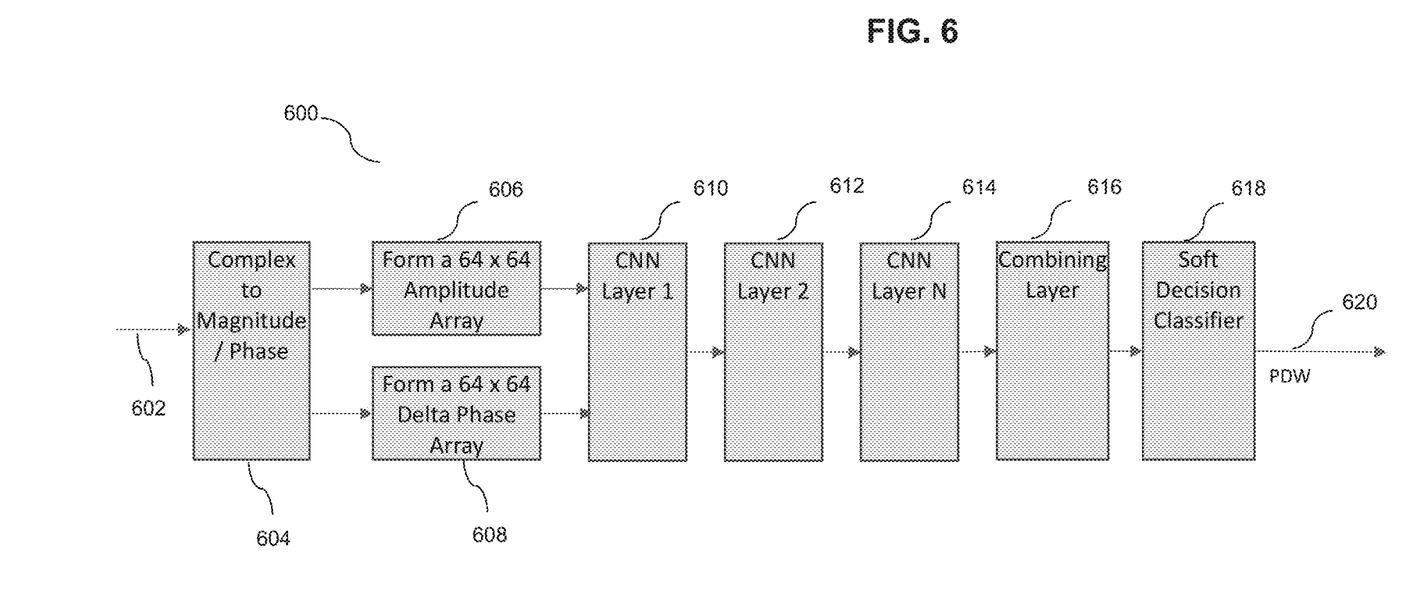
FIG. 6 shows a simplified block diagram of an exemplary deep learning pulse characterizer, according to some embodiments of the disclosed invention.

FIG. 6 shows a simplified block diagram of an exemplary machine learning pulse characterizer 600, according to some embodiments of the disclosed invention. In some embodiments, the MLPC portion of the CS decoder and MLPC 314 may be a deep learning machine that uses multiple layers to progressively extract higher level features from the detected pulses to characterize them. In some embodiments, machine learning pulse characterizer 600 is a deep learning pulse characterizer that employs a Convolutional Neural Network (CNN) to determine the classical parameters of an RF emitter (e.g., a radar) pulse, including RF carrier, ToA, pulse width, center frequency, modulation type and the like. These parameters form a Pulse Descriptor Word (PDW).

The TOA of the RF pulse (received by three or more receivers) is used to locate the identified emitter, while the parameters of the RF emitter are utilized to identify the type, make and model of the emitter. Each radar type, make and model uses different radar parameters that are selected according to it's function, performance characteristics and global spectrum allocations. A great deal of effort is spent collecting and characterizing radars across the globe by the US Government. This database of radar knowledge and information associates emitter RF, pulse width, pulse modulation parameters, pulse repetition interval (PRI) and PRI modulation parameters to specific emitter types, makes and models. Moreover, this body of knowledge is used to train the ML Pulse Association function (314) using the features contained within the PDWs.

As known in the art, a CNN employs a mathematical operation called convolution and include an input layer, an output layer, and multiple hidden layers. The hidden layers of a CNN typically consist of a series of convolutional layers that convolve with a multiplication or other dot product.

The input 602 to the pulse characterizer 600 is a pulse snippet from the detector consisting of X I/Q samples (e.g., 4096 I/Q samples). This pulse snippet includes the decoded sequence of RF signal in each channel (bandwidth). A complex-to-magnitude/phase (CTMP) circuit 604 converts the I/Q samples into a pair of rectangular arrays; an amplitude array 606 and a delta phase array 608. The amplitude array 606 includes the amplitude over the pulse duration and the delta phase array 608 includes the delta phase from sample to sample, similar to the known technique described in "Spectrum Monitoring for Radar Bands using Deep Convolutional Neural Networks," the entire content of which is expressly incorporated by reference herein.

A sequence of N convolutional layers 610, 612 and 614 are developed that achieve the desired performance. One or more layers focus on the Amplitude array to detect sharp rising and falling edges to estimate TOA and pulse width. One or more layers focus on the Delta Phase Array to determine modulation. No modulation is characterized by a constant delta phase over the pulse. A chirp pulse is characterized by a continuous linear or non-linear increase or decrease in delta phase over the pulse. The rate of increase or decrease indicates the chirp rate. Phase modulated pulses are indicated by discontinuous jumps between flat delta phase regions and may also be indicated by sharp dropouts in magnitude at the phase transitions. The features are then flattened into a linear array by a combining layer 616 and fed to a classifier 618. The output of the classifier 618 is a PDW that include the classical parameters of an RF emitter (e.g., a radar) pulse, including RF carrier, Time of Arrival (ToA), pulse width and modulation type.

FIG. 7 illustrates a simplified block diagram of an exemplary machine learning 700 for associating pulses with certain type of emitters, according to some embodiments of the disclosed invention. In some embodiments, machine learning 700 is a deep learning pulse association circuit that employs a Deep Neural Network (DNN) and speaker diarization techniques to associate PDWs originating from each emitter in the field of view and identify that emitter in terms of its emitter ID and mode. As shown, a PDW signal 701 (e.g., PDW signal 315 in FIG. 3) is received by audio converter 702. The audio converter 702 converts PDWs into an audio stream, for example, by placing a "1" on a timeline if a pulse is present and low pass filtering this timeline. The audio is partitioned into overlapping frames and the Mel-frequency Cepstral Coefficients (MFCC) computed for each frame, by a MFCC feature extractor 704. These coefficients represent the features over which the DNN process to uniquely identify the speaker given the DNN coefficients derived through the learning process of the DNN. A sequence of N DNN layers 706, 708 and 710 are developed that achieve the desired performance.

A radar transmitting with a constant PRI will produce a speaker in the audio domain at a single pitch or tone with no timbre and no breaks or syllables. Different radars will have different fundamental pitches with simple or complex over tones as PRI modulation is introduced. Mode changes will produce breaks, creating syllables. The first layers will look for these patterns and identify individual speakers that correspond to individual RF emitters. The speech patterns of each speaker will be used to perform the first level of association to a specific RF emitter type, make and model and mode. Ambiguities will be resolved by adding in the other PDW parameters of pulse width, RF and modulation parameters.

A pooling layer 712 then pulls the layers together. An embedded layer 714 is where the PDW parameters are embedded into the model. A soft decision classifier then classifies each separated speaker into a specific radar type, make, model and mode. This information including the emitter ID and model, along with a consolidated time of arrival list of each PDW goes into an Intercept. Intercepts across multiple platforms are compared and those with the same type, make, model and mode are used to calculate a geoposition based upon the time difference of arrival across these multiple platforms. One skilled in the art would realize that the machine learning devices shown in FIGS. 6 and 7 may be implemented as electronic circuits, such one or more FPGAs, one or more general-purpose or specific-purpose processors executing firmware and software. In some embodiments, the processors implementing the machine learning devices may be part of the processing hardware of the receiver.

Figure 8:
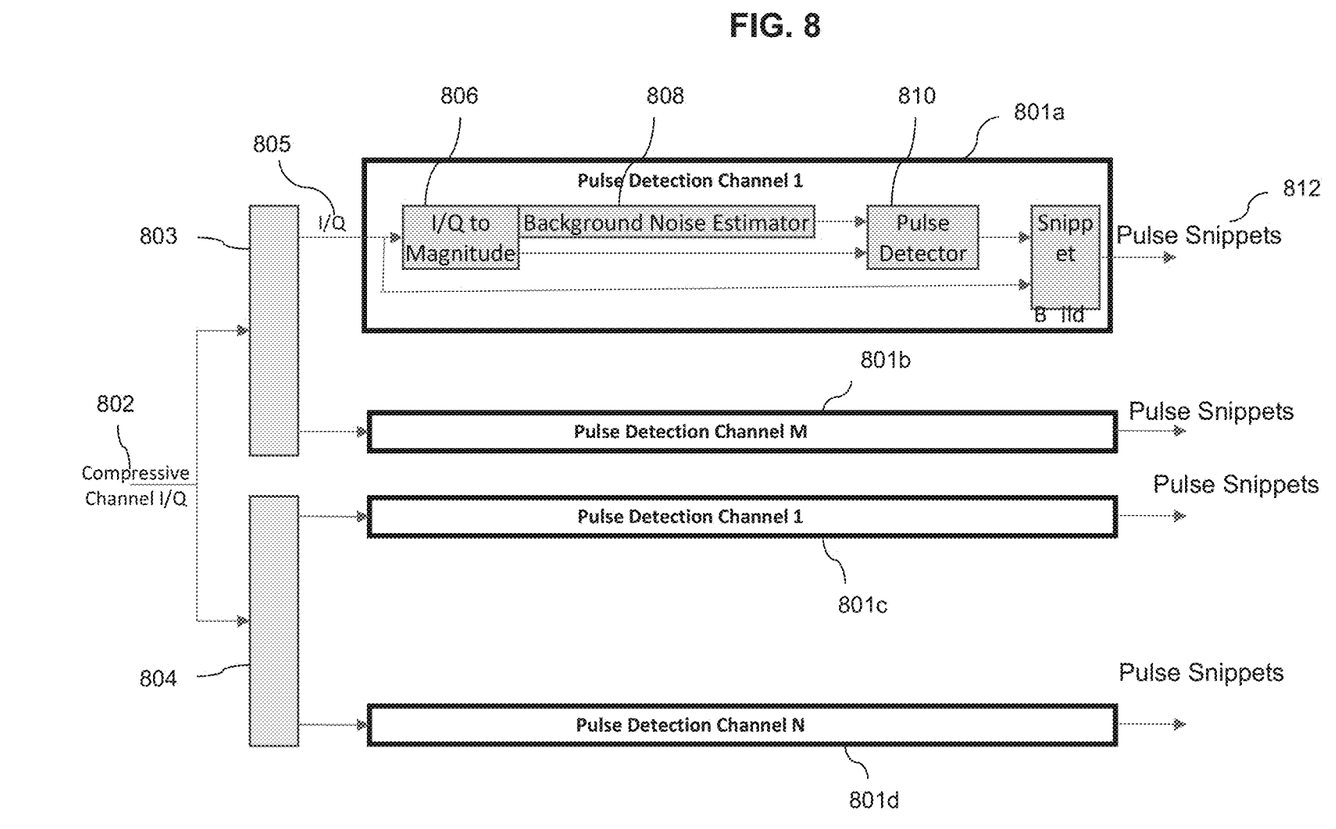
FIG. 8 illustrates a simplified block diagram of a channelized pulse detection circuit, according to some embodiments of the disclosed invention.

FIG. 8 illustrates a simplified block diagram of a channelized pulse detection circuit 800, according to some embodiments of the disclosed invention. As shown, the channelized pulse detection circuit 800 includes one or more channelizers (801*a*, 801*b*, 801*c* and 801*d*) implemented with a poly-phase filter bank (803 and 804) or a Fast Fourier Transform (FFT) circuit (803 and 804). The bandwidths of the filter bank channels are determined by the target signal bandwidths, expected emitter densities and required sensitivity and geolocation accuracy. For example, a good TOA/geolocation accuracy requires detection channel bandwidths on the order of 50-100 MHz, while optimal sensitivity and signal separation in dense bands might require detection channel bandwidths less than 5 MHz. Some embodiments may include two parallel filter banks of different bandwidths to achieve good TOA accuracy as well as optimal sensitivity. For example, filter bank 803 may have a narrow bandwidth, while filter bank 804 may have a wide bandwidth. When a detection filter bank channel I/Q input 805 over the pulse is combined with metadata, including channel and filter bank number, time of first sample, sample rate and background noise, a pulse snippet 812 is formed for each received pulse 802.

In some embodiments, each detection channel includes a time domain, constant false alarm, pulse detection circuit at the output of every filter bank detection channel. Each pulse detection circuit 801 receives detection channel I/Q data and converts each I/Q sample of that channel into a magnitude sample 806. A set of filters located within a background noise estimator 808 are used to separate signal energy from thermal noise within the channel and estimate the thermal noise power. This estimate is multiplied by a constant, selected to achieve a desired false alarm rate and fed to the pulse detector 810. The pulse detector 810 uses this input as a threshold against the stream of magnitude data. Using a noise tolerant method, such as an M of N detector, the pulse detector determines when a pulse is present and notes the sample number of when the pulse begins and ends. This information is used to populate the pulse snippet 812 with detection channel I/Q data over the pulse interval plus the pre/post-amble I/Q samples to fill the fixed sample size (e.g. 4096). The pulse snippet also stores additional information, including start time of the first sample and the I/Q sample rate to translate the samples to a common time reference across all collection platforms. In addition, detection channel number and CS channel number is stored in the pulse snippet 812 to translate each I/Q sample back to the originating RF that was received at the antenna 302 or 402.

Figure 9:
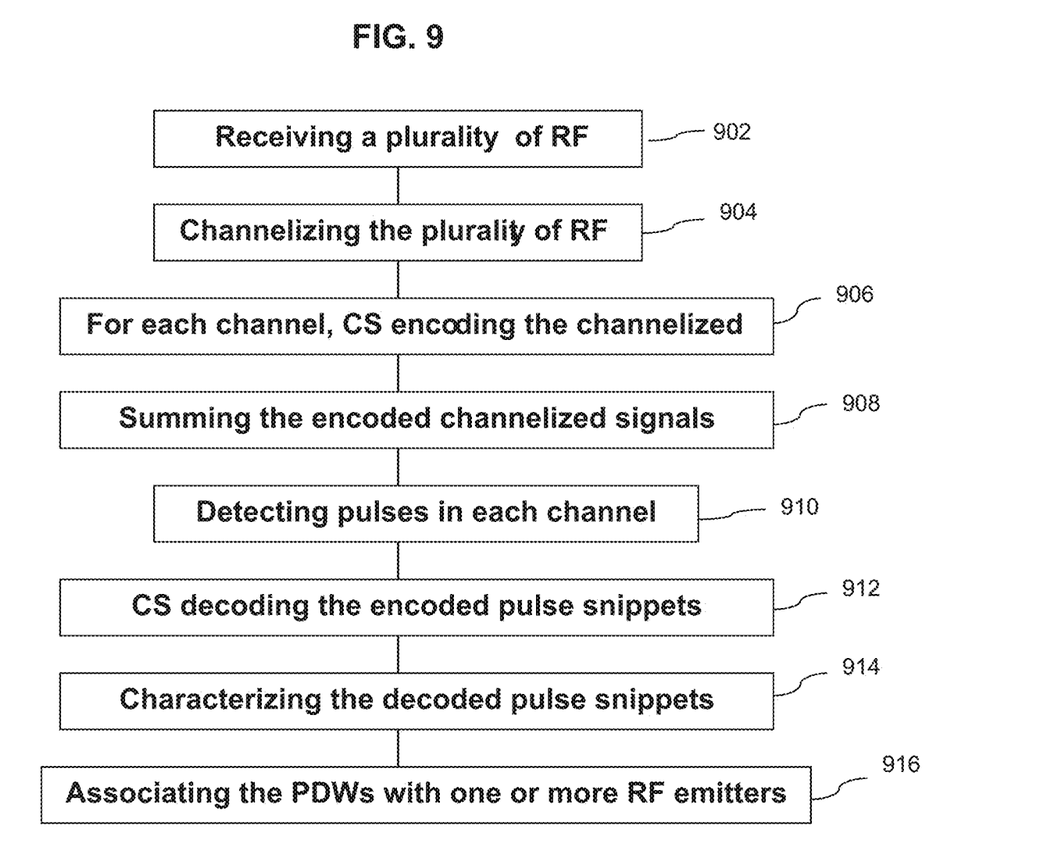
FIG. 9 depicts a simplified process flow for a smart receiver, according to some embodiments of the disclosed invention.

FIG. 9 depicts a simplified process flow for a smart receiver, according to some embodiments of the disclosed invention. As shown in block 902, a plurality of RF signals is received from one or more RF emitters, for example, one or more radars. In block 904, the RF signals are channelized into a plurality of channels, for example, by respective channelizer 304-1 to 304-N in FIG. 3, where each channel has the same bandwidth. In block 906, for each channel, the channelized signal is compressive sensing (CS) encoded to produce an encoded channelized signal in each of the plurality of channels, for example, by the CS encoders 306-1 to 306-Y in FIG. 3. The CS encoders operate with a narrow bandwidth chip rate. The encoded channelized signals of all of the plurality of channels are then summed to produce an I/Q data, in block 908.

In block 910, pulses in each channel are detected, for example, by channelized pulse detection circuit 310 of FIG. 3 as described above, and encoded pulse snippets are generated from the I/Q data. The encoded pulse snippets are then CS decoded, in block 912 and characterized by a first machine learning device using a trained process to produce pulse description words (PDWs), in block 914. In block 916, the PDWs are associated with one or more RF emitters and the one or more RF emitters are identified by a second machine learning device. Information, including the location of identified RF emitters, can then be used to take action for the identified emitter, such as mitigate the threat, create an ingress/egress flight path that avoids the threat or is used to update the database of a radar warning receiver.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims and drawings.

What is claimed is:

1. A radio frequency (RF) receiver for identifying an RF emitter comprising:
   one or more channelizers for channelizing a plurality of RF signals into a plurality of channels;
   a compressive sensing (CS) encoder for each channel to CS encode the channelized signal to produce an encoded channelized signal in each of the plurality of channels;
   a summer to sum the encoded channelized signals of all of the plurality of channels to produce an I/Q data;
   a channelized pulse detection circuit to detect pulses in each channel and produce encoded pulse snippets from the I/Q data;
   a CS decoder for each channel to CS decode the encoded pulse snippets;
   a first machine learning device to characterize the decoded pulse snippets and to produce pulse description words (PDWs); and
   a second machine learning device to associate the PDWs with one or more RF emitters and identify the one or more RF emitters.

2. The RF receiver of claim 1, wherein each CS encoder alters the CS encoding to limit spreading bandwidth of the channelized signal using a Compressive Multiplexor (CMUX) technique.

3. The RF receiver of claim 1, wherein each CS encoder samples its input signal at a range of 5% to 10% of a system clock rate.

4. The RF receiver of claim 1, wherein each CS encoder operates in a narrower bandwidth than a bandwidth of the receiver.

5. The RF receiver of claim 1, wherein the summer includes additional inputs to accommodate additional channels.

6. The RF receiver of claim 1, wherein the channelized pulse detection circuit determines which channel the I/Q data is coming from to determine type, timing and frequency of the channelized signals.

7. The RF receiver of claim 6, wherein the channelized pulse detection circuit includes one or more channelizers, each including a poly-phase filter bank or a Fast Fourier Transform (FFT) circuit.

8. The RF receiver of claim 6, wherein each CS encoder utilizes a unique spreading code to enable the CS decoder to determine which of the channels the pulse was received from.

9. The RF receiver of claim 8, wherein the CS decoder multiplies each of the spreading codes by the detected pulse, measures an average power over the pulse, determines the code that produces a maximum signal power to be an originating code, and determines a channel from which the pulse originated responsive to the code producing the maximum signal power.

10. The RF receiver of claim 6, further comprising utilizing a unique spreading code to determine which of the channels the pulse was received from.

11. The RF receiver of claim 10, further comprising multiplying each of the spreading codes by the detected pulse, measuring an average power over the pulse, determining the code that produces a maximum signal power to be an originating code, and determining a channel from which the pulse originated responsive to the code producing the maximum signal power.

12. The RF receiver of claim 1, further comprising a processor to determine a location of the identified one or more RF emitters.

13. The RF receiver of claim 1, wherein the PDWs include carrier or RF frequency, Time of Arrival, pulse width, pulse modulation type and modulation parameters.

14. The RF receiver of claim 1, wherein the second machine learning device utilizes a database of radar information to associate emitter RF, pulse width, pulse modulation parameters, pulse repetition interval (PRI) and PRI modulation parameters to specific RF emitter types, makes and models to associate the PDWs with one or more RF emitters and identify the one or more RF emitters.

15. A method for identifying a radio frequency (RF) emitter, the method comprising:
   channelizing a plurality of RF signals into a plurality of channels;
   for each channel, compressive sensing (CS) encoding the channelized signal to produce an encoded channelized signal in each of the plurality of channels;
   summing the encoded channelized signals of all of the plurality of channels to produce an I/Q data;
   detecting pulses in each channel and producing encoded pulse snippets from the I/Q data;
   CS decoding the encoded pulse snippets;
   characterizing the decoded pulse snippets to produce pulse description words (PDWs), by a first machine learning device; and
   associating the PDWs with one or more RF emitters and identify the one or more RF emitters, by a second machine learning device.

16. The method of claim 15, further comprising altering the CS encoding to limit spreading bandwidth of the channelized signal using a Compressive Multiplexor (CMUX) technique.

17. The method of claim 15, further comprising determining which channel the I/Q data is coming from to determine type, timing and frequency of the channelized signals.

18. The method of claim 15, further comprising determining a location of the identified one or more RF emitters.

19. The method of claim 15, wherein the PDWs include carrier or RF frequency, Time of Arrival, pulse width, pulse modulation type and modulation parameters.

20. The method of claim 15, further comprising utilizing a database of radar information to associate emitter RF, pulse width, pulse modulation parameters, pulse repetition interval (PRI) and PRI modulation parameters to specific RF emitter types, makes and models to associate the PDWs with one or more RF emitters and identify the one or more RF emitters.

* * * * *